United States Patent [19]
Nakanishi et al.

[11] Patent Number: 6,107,563
[45] Date of Patent: Aug. 22, 2000

[54] PHOTOELECTRIC CONVERTER HAVING LIGHT DIFFUSION LAYER

[75] Inventors: Ken Nakanishi; Hiroshi Taniguchi, both of Nara, Japan

[73] Assignee: Sharp Kabushiki Kaisha, Osaka, Japan

[21] Appl. No.: 09/179,193

[22] Filed: Oct. 27, 1998

[30] Foreign Application Priority Data

Oct. 27, 1997 [JP] Japan .................................. 9-293905
Oct. 12, 1998 [JP] Japan .................................. 10-289134

[51] Int. Cl.⁷ .................................................. H01L 31/00
[52] U.S. Cl. .................................................. 136/256
[58] Field of Search .................................. 136/256, 252, 136/246

[56] References Cited

U.S. PATENT DOCUMENTS 5,421,909  6/1995  Ishikawa et al. ..................... 136/256

FOREIGN PATENT DOCUMENTS

| 559 141 | 9/1993 | European Pat. Off. ...... H01L 31/216 |
| 735 596 | 10/1996 | European Pat. Off. ...... H01L 31/055 |
| 6-029562 | 2/1994 | Japan ............................ H01L 31/04 |
| 7-115214 | 5/1995 | Japan ............................ H01L 31/04 |
| 8-018084 | 1/1996 | Japan ............................ H01L 31/04 |
| 8-162655 | 6/1996 | Japan ............................ H01L 31/04 |

*Primary Examiner*—Mark Chapman
*Attorney, Agent, or Firm*—Nixon & Vanderhye P.C.

[57] ABSTRACT

The photoelectric converter includes a first electrode layer, a semiconductor photoelectric conversion layer and a second electrode layer laminated on a substrate. A light diffusion layer for causing light diffusion is provided between the substrate and the first electrode layer. The light diffusion layer has a surface texture including fine unevenness suitable for causing light diffusion, and the light diffusion layer is formed by utilizing a resin including particles suitable for causing the surface texture.

12 Claims, 3 Drawing Sheets

LIGHT

PHOTOELECTRIC CONVERTER HAVING LIGHT DIFFUSION LAYER

BACKGROUND OF THE INVENTION

1. Field of the Invention

The present invention relates to a photoelectric converter utilized, for example, as a solar cell and more particularly to an improvement in the thin film semiconductor photoelectric converter.

2. Description of the Background Art

A thin film semiconductor photoelectric converter generally includes, as its basic structure, a first electrode layer, a photoelectric conversion layer formed of a semiconductor film, and a second electrode layer, which are laminated on a substrate. In order to attain high efficiency of photoelectric conversion in the thin film photoelectric converter, therefore, light has to be efficiently absorbed and converted into electric energy in the photoelectric conversion layer formed of a thin semiconductor film.

In the thin film photoelectric converter utilized as a solar cell, the efficiency of photoelectric conversion has recently been improved by diffusing light directed into the photoelectric conversion layer and by confining the light inside the layer (light confinement effect). In order to cause the light confinement effect, an electrode layer which has a surface texture including fine unevenness and which is formed of transparent conductive tin oxide ($SnO_2$) and so on, for example, is formed on a glass substrate (see Japanese Patent Laying-Open Nos. 8-18084 and 7-115216, for example). The light directed into the photoelectric converter is scattered by the surface texture of the electrode layer and confined inside the semiconductor photoelectric conversion layer. In short, most of the light directed into the photoelectric converter is efficiently absorbed and converted into electric energy in the semiconductor layer and therefore a high density of short-circuit current can be attained.

Here, the electrode layer of transparent conductive oxide having a surface texture is generally formed by controlling deposition conditions in the sputtering method or the CVD method. However, it is not easy to form a transparent electrode layer having a surface texture which includes unevenness having such height differences that cause an enough light confinement effect by the sputtering method or the CVD method.

SUMMARY OF THE INVENTION

In view of the prior art above, an object of the present invention is to easily and inexpensively provide a thin film photoelectric converter having high efficiency of conversion due to a sufficient light confinement effect.

A photoelectric converter according to the present invention includes a first electrode layer, a semiconductor photoelectric conversion layer and a second electrode layer formed in this order on a substrate, and a light diffusion layer for causing light diffusion, provided between the substrate and the first electrode layer, the light diffusion layer having a surface texture including fine unevenness suitable for causing light diffusion and formed by utilizing a resin including particles suitable for causing the surface texture.

Preferably, such particles are formed of a selected one of silicon oxide, titanium oxide, aluminum oxide and zirconium oxide and have a size in a range from 0.01 $\mu$m to 10 $\mu$m.

Preferably, the resin included in the light diffusion layer is a selected one of an acrylic resin, a polyimide resin, a polyester resin, a silicone resin and a polyether sulfone resin.

Preferably, the substrate is formed of a resin film formed of a selected one of a polyimide resin, a polyester resin, a polycarbonate resin, a polyether sulfone resin and a fluororesin, or formed of a metal selected from stainless, aluminum and plated steel.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the figures of the present invention, photoelectric converters according to several embodiments of the present invention are shown in schematic cross sectional views. In each figure of the present invention, dimensions are varied as necessary for clarity of the figures and actual dimensions are not reflected.

Figure 1:
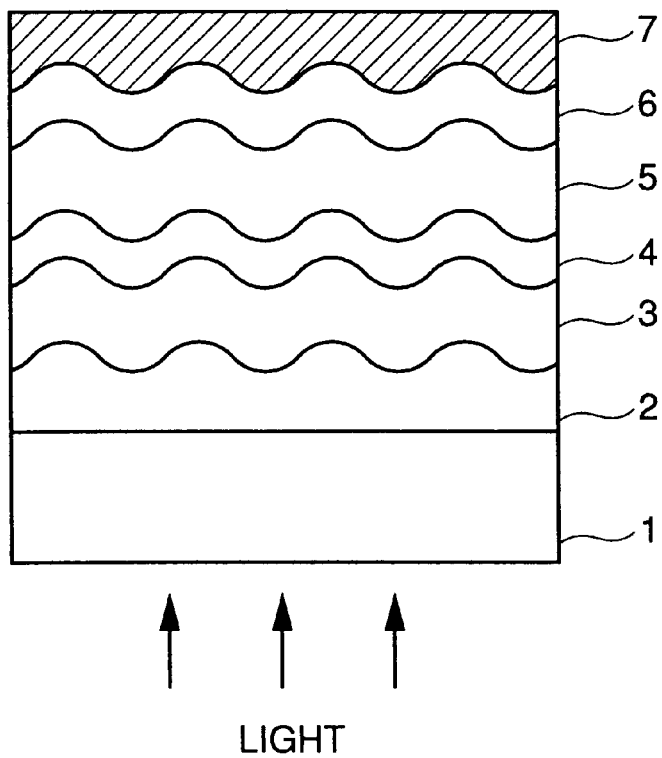
FIG. 1 is a cross sectional view schematically showing a photoelectric converter according to one embodiment of the present invention.

In a photoelectric converter according to one embodiment of the present invention as shown in FIG. 1, a light diffusion layer 2 which has an uneven surface to cause light diffusion is formed on a transparent substrate 1. On light diffusion layer 2, a transparent electrode layer 3 formed of ITO (Indium Tin Oxide) is formed, and preferably a transparent layer 4 formed of conductive ZnO is also laminated. ZnO transparent layer 4 functions to increase the light diffusion effect by causing multiple light interference and also functions as part of the transparent electrode.

On ZnO layer 4, an amorphous silicon (a-Si) layer, for example, is deposited as a semiconductor photoelectric conversion layer 5. For example, a-Si layer 5 may include a p type sublayer, an i type sublayer and an n type sublayer (not shown) successively laminated.

On a-Si layer 5, a back reflective metal electrode layer 7 is laminated, preferably with a ZnO transparent layer 6 interposed therebetween. ZnO layer 6 functions to prevent diffusion of a metallic atom from metal electrode layer 7 to a-Si layer 5. Similarly to ZnO layer 4, ZnO layer 6 functions to increase the scattering reflection effect of light at the bottom surface including surface unevenness of back metal electrode layer 7 by causing multiple light interference and also functions as part of the back electrode.

In the photoelectric converter as shown in FIG. 1, light is of course directed from the side of transparent substrate 1. An insulator resin film such as a polyester film can be used as transparent substrate 1. When resin film substrate 1 is used, the photoelectric converter can be made lighter and easier to handle, and the manufacturing cost can also be reduced. Further, not only a polyester resin but a polyimide resin, a polycarbonate resin, a polyether sulfone resin (PES) or a fluororesin, for example, can be advantageously used as the material of resin film substrate 1. Instead of the resin film, a glass plate may also be used as substrate 1.

Figure 2:
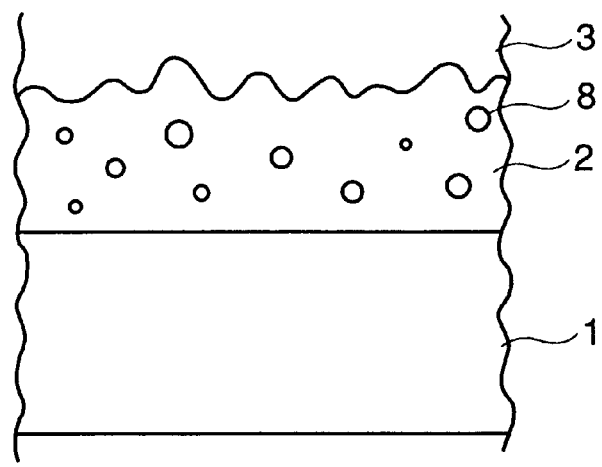
FIG. 2 is a partially enlarged view of the photoelectric converter in FIG. 1.

As shown in the cross sectional view 2 illustrating part of FIG. 1 on a greater scale, light diffusion layer 2 can be formed by using a photo-curing resin including silica (silicon oxide) particles 8, for example. An ultraviolet-curing acrylic resin, for example, can be used as the photo-curing resin. Further, a polyimide-type resin having excellent heat resistance may be used instead of the photo-curing resin. Besides, a polyester resin, a silicone resin or a polyether sulfone resin, for example, can also be advantageously used as the resin included in light diffusion layer 2. Although a limited number of fine silica particles 8 are shown in FIG. 2 for clarity of the figure, a larger number of particles 8 are actually included.

Due to the fine silica particles included in the photo-curing resin, the polyimide-type resin, or the like, a surface texture including fine unevenness is formed at the top surface of light diffusion layer 2. The surface unevenness of light diffusion layer 2 is transferred to the top surfaces of other layers 3, 4, 5 and 6 which are successively laminated thereon. This causes the light confinement effect due to light diffusion of incident light at interfaces between layers 2 to 7. Accordingly, the optical path length in a-Si photoelectric conversion layer 5 is increased and the efficiency of light absorption is improved. In short, the output current density of the photoelectric converter can be increased and the efficiency of photoelectric conversion can be improved. As a material of particles 8, titanium oxide ($TiO_2$), aluminum oxide ($Al_2O_3$), zirconium oxide ($ZrO_2$), indium tin oxide ($In_2O_3 \cdot SnO_2$), tin oxide ($SnO_2$), magnesium fluoride ($MgF_2$) or the like may be used instead of silica.

Preferably, particles 8 have the size in a range from 0.01 $\mu$m to 10 $\mu$m and, in this case, a surface texture which includes unevenness having height differences in a range from 0.05 $\mu$m to 5 $\mu$m can be formed at light diffusion layer 2. It is experimentally confirmed that the surface texture is most suitable for scattering light in the relations with the wavelength of incident light when the surface texture includes unevenness having height differences in a range from 0.005 $\mu$m to 5 $\mu$m. When the size of particles 8 is smaller than 0.01 $\mu$m or larger than 10 $\mu$m, however, scattering of the incident light is insufficient, or transmission of the incident light is hindered. Further, particles 8 are aggregated, making height differences in the surface unevenness non-uniform.

Specifically, light diffusion layer 2 can be formed by applying a photo-curing acrylic resin including particles 8 on substrate 1 and curing it by ultraviolet irradiation. As the method of applying a resin on substrate 1, the spin coating, dip coating, spray coating, bar coating or curtain coating method can be used, for example. Specifically, a polymer formed by polymerizing monomers such as acrylic acid, acrylate, acrylamide, acrylonitile, methacrylic acid, and methacrylate can be used as the acrylic resin. Further, the above-described polyether resin or the like can be used instead of the acrylic resin as the photo-curing resin. When a polymide-type resin is used instead of the photo-curing resin, a resin which is melted by heating and includes particles 8 is applied on substrate 1 and solidified by cooling to form light diffusion layer 2. After light diffusion layer 2 is formed, other layers 3 to 7 can be successively laminated by the same well-known method as in conventional photoelectric converters.

As described above, in the photoelectric converter as shown in FIGS. 1 and 2, light diffusion layer 2 can be formed only by applying and curing a resin including particles formed of an inexpensive material such as silica on substrate 1. Therefore, according to the present invention, the photoelectric converter having a sufficient light confinement effect can be provided inexpensively and easily compared with the case where an $SnO_2$ layer including surface unevenness is formed by using the sputtering method or the CVD method as in the prior art.

Figure 3:
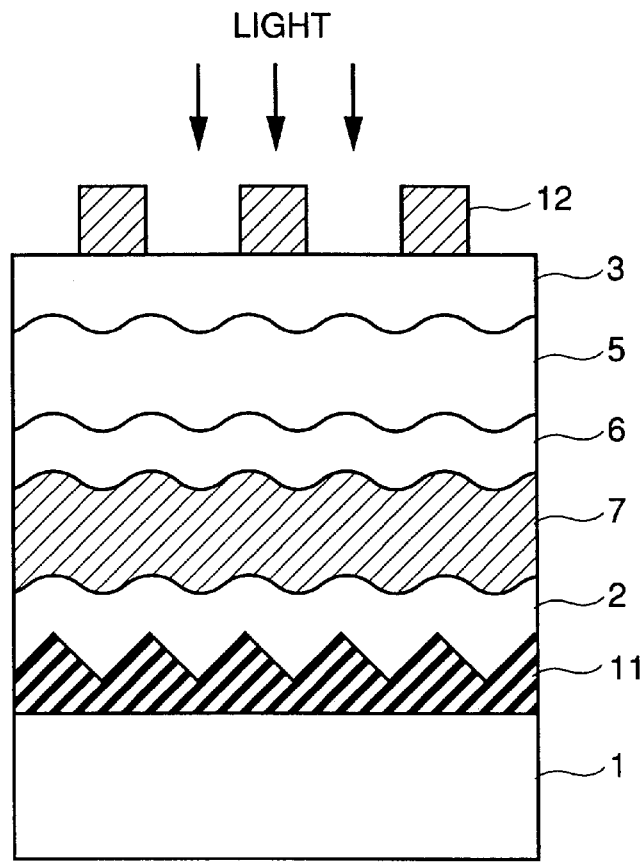
FIG. 3 is a cross sectional view schematically showing a photoelectric converter according to another embodiment of the present invention.

FIG. 3 shows a photoelectric converter according to another embodiment of the present invention. In the photoelectric converter, an insulator layer 11 which has a surface including a plurality of grooves is formed on substrate 1. Light diffusion layer 2 including surface unevenness, back reflective metal electrode layer 7 formed of Ag, and transparent layer 6 formed of ZnO are successively laminated on insulator layer 11. On ZnO layer 6, a-Si photoelectric conversion layer 5 including an n type sublayer, an i type sublayer and a p type sublayer (not shown) which are successively laminated is formed. Transparent electrode layer 3 formed of ITO and a comb-shaped, current collecting metal electrode layer 12 formed of Ag are laminated on a-Si photoelectric conversion layer 5. In the photoelectric converter as shown in FIG. 3, light is of course directed into photoelectric conversion layer 5 through comb-shaped metal electrode layer 12 and transparent electrode layer 3.

In the photoelectric converter including insulator layer 11, not only a resin film but a metallic foil such as stainless (SUS430, for example), aluminum or plated steel can be used as substrate 1. By using a thin metallic foil as substrate 1 as well, the photoelectric converter can be made lighter and easier to handle, and the manufacturing cost can also be reduced. Insulator layer 11 can be formed of a polyimide resin, for example. Insulator layer 11 can also be formed of metal oxide having insulation properties as alumina (aluminum oxide). When alumina insulator layer 11 is to be formed, an aluminum foil can preferably be used as substrate 1.

The top surface of insulator layer 11 shown in FIG. 3 includes a plurality of grooves, with the grooves each having a substantial V shape in the cross section orthogonal to its longitudinal direction. As shown in the cross sectional view 4 illustrating part of FIG. 3 on a larger scale, light diffusion layer 2 formed of a resin layer including particles 8 is formed on insulator layer 11 including the V shaped grooves. Accordingly, light diffusion layer 2 has a surface texture which includes fine unevenness caused not only by the V shaped unevenness transferred from insulator layer 11 but by particles 8.

Back metal electrode layer 7 formed on light diffusion layer 2 also functions as a light reflective layer, and its top surface has a texture including unevenness transferred from the top surface of light diffusion layer 2. In other words, the top surface of light diffusion layer 2 plays a role as a pattern for forming the texture on the top surface of metal electrode layer 7.

Figure 4:
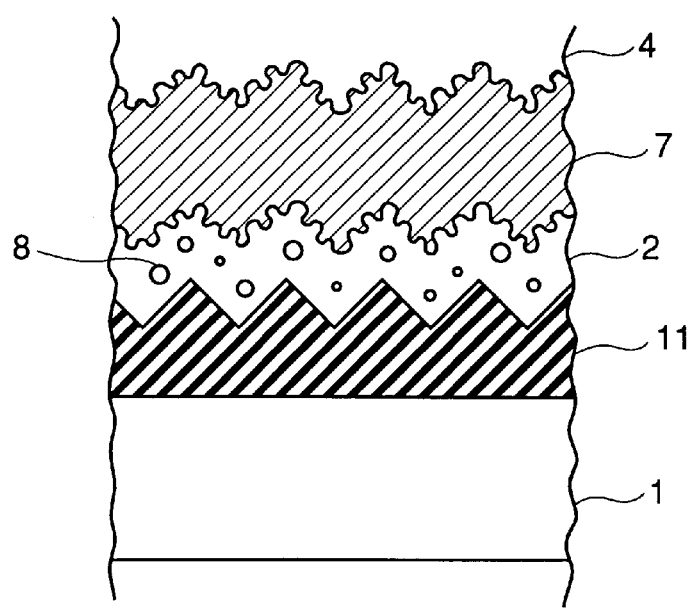
FIG. 4 is a partially enlarged view of the photoelectric converter in FIG. 3.

In the photoelectric converter as shown in FIGS. 3 and 4, light emitted from above passes through transparent electrode layer 3 and the light is absorbed in a-Si photoelectric conversion layer 5. Light passing responsive through ZnO transparent layer 6 without being absorbed by a-Si layer 5 is almost completely scattered and reflected by the uneven surface of metal electrode layer 7. The scattered and reflected light is returned into a-Si photoelectric conversion layer 5 and efficiently converted into electric energy. Since the top surface of metal electrode layer 7 includes two types of unevenness caused by the V shaped grooves of insulator layer 11 and particles 8 included in light diffusion layer 2, a high light diffusion effect can be attained. Thus, the light confinement effect in a-Si photoelectric conversion layer 5 is improved.

Preferably, the V shaped grooves of insulator layer 11 are arranged at a pitch in a range from 10 $\mu$m to 30 $\mu$m, and each groove has a depth in a range from 10 μm to 30 μm and an opening angle in a range from 45° to 120°. If the pitch or depth is smaller than 10 μm or larger than 30 μm, uniform surface unevenness cannot be attained and it cannot contribute sufficiently to the light diffusion effect. If the opening angle is smaller than 45°, it is difficult to process insulator layer 11. If the angle is larger than 120°, it cannot contribute sufficiently to the light diffusion effect.

When the photoelectric converter as shown in FIG. 3 is utilized as a large solar cell, the opening angle of the groove is desirably in a range from 45° to 120°. However, the groove pitch may be in a range from 0.5 mm to 2 mm, and the depth of each groove may be in a range from 0.3 mm to 2 mm. Further, the groove formed in insulator layer 11 is not always limited to the V shaped cross section and it may have any cross section such as an U shape or a semi-circular shape.

It is noted that the groove of insulator layer 11 formed of a resin may be formed by stamping a metallic die to the resin layer, for example. When insulator layer 11 is to be formed of metal oxide such as alumina, the sol.gel method is utilized and a metallic die may be stamped to insulator layer 11 in a gel state.

Figure 5:
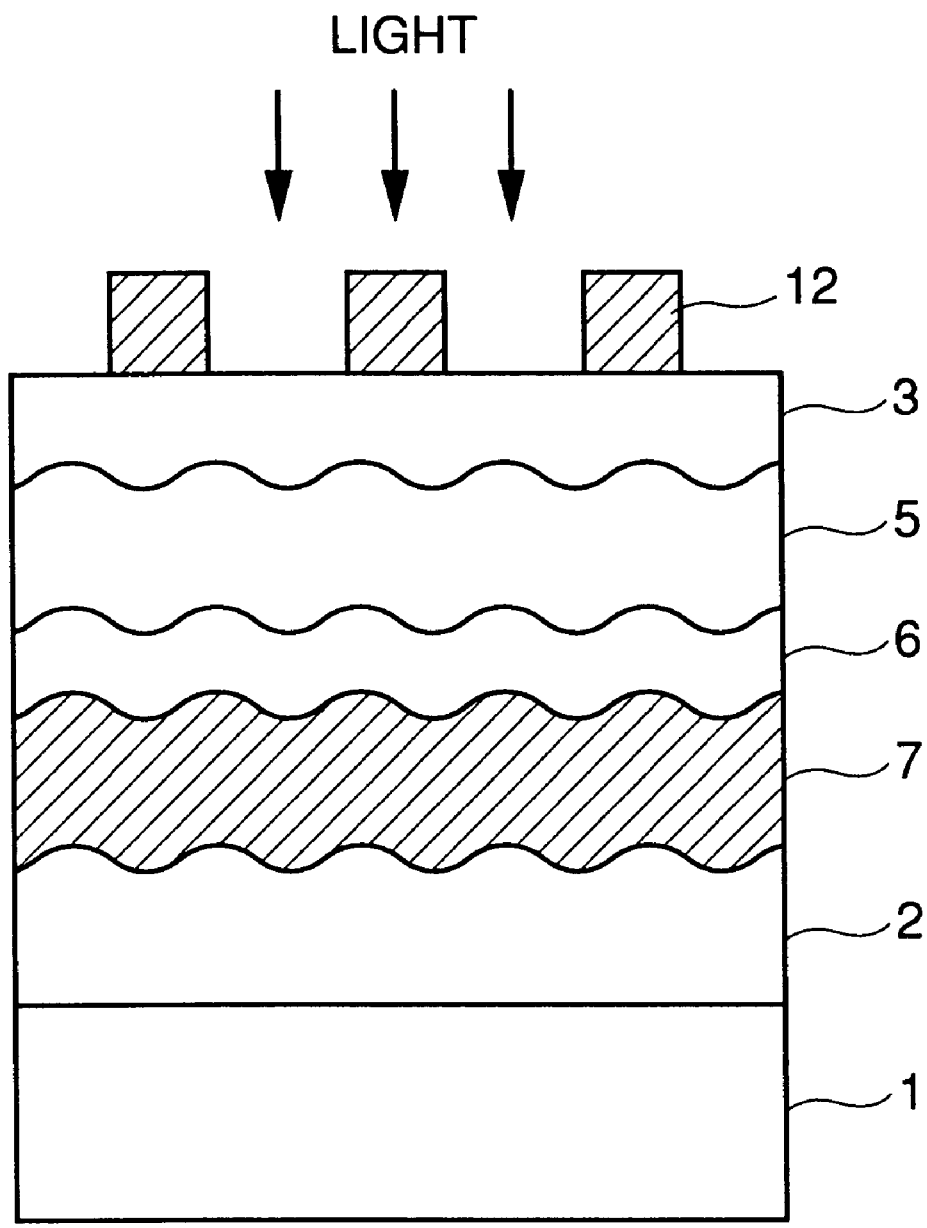
FIG. 5 is a cross sectional view schematically showing a photoelectric converter according to still another embodiment of the present invention.

FIG. 5 shows a photoelectric converter according to still another embodiment of the present invention. The photoelectric converter in FIG. 5 is different from the one shown in FIG. 3 in that insulator layer 11 is not provided in the photoelectric converter in FIG. 5. In other words, light diffusion layer 2 is directly formed on the flat surface of substrate 1 in the photoelectric converter in FIG. 5. However, light diffusion layer 2 may be formed on substrate 1 having a surface with V shaped grooves formed thereat by modifying part of the photoelectric converter in FIG. 5. Further, the photoelectric converter in FIG. 1 may be partly modified to insert insulator layer 11 shown in FIG. 3 between substrate 1 and the light diffusion layer. However, it is necessary in this case that insulator layer 11 is transparent. Further, the photoelectlic converters as described in the embodiments above can of course be used not only for solar cells but for various uses such as optical switches or an optical sensors.

Several examples of the photoelectric converter actually manufactured according to the present invention will be described in the following along with comparative examples.

EXAMPLE 1

Corresponding to FIGS. 1 and 2, a photoelectric converter in Example 1 was manufactured. In Example 1, a polyethylene terephthalate film was used as substrate 1. An acrylic resin of the ultraviolet-setting type which includes silica particles having an average size of 0.5 μm was applied on substrate 1 by a roll coater. The acrylic resin applied film was heated at 80° C. for five minutes and set by ultraviolet irradiation for two minutes to form light diffusion layer 2 having a surface texture including fine unevenness. On light diffusion layer 2, ITO layer 3 having a thickness of 140 nm and ZnO layer 4 having a thickness of 50 nm were successively deposited as a transparent electrode by the sputtering method.

On ZnO layer 4, a-Si photoelectric conversion layer 5 including a p sublayer, an i sublayer and an n sublayer successively deposited was formed by the plasma CVD method. The thicknesses of the p sublayer, the i sublayer and the n sublayer were set at 10 nm, 500 nm and 30 nm. On a-Si photoelectric conversion layer 5, ZnO layer 6 having a thickness of 60 nm and Ag layer 7 having a thickness of 500 nm were successively laminated as a back electrode by the sputtering method.

TABLE 1

| Substrate Temperature (° C.) | Power (W/cm²) | Pressure (torr) | Gas Flow Rate (sccm) | | | |
|---|---|---|---|---|---|---|
| | | | SiH₄ | H₂ | B₂H₆ | PH₃ |
| p layer 170 | 0.5 | 0.25 | 1 | 100 | 0.005 | — |
| i layer | 0.1 | 0.12 | 42 | 14 | — | — |
| n layer | 0.5 | 0.25 | 1 | 100 | — | 0.01 |

When the thus obtained photoelectric converter in Example 1 was irradiated with light of AM1.5 (standard sunlight spectra) at the intensity of 100 mW/cm² by using a solar simulator, the short-circuit current density Jsc, the open-circuit voltage Voc, the fill factor F.F. and the conversion efficiency η as shown in Table 2 were obtained as photoelectric properties.

TABLE 2

| | Short-Circuit Current Density Jsc (mA/cm²) | Open-Circuit Voltage Voc (V) | Fill Factor F.F. | Conversion Efficiency η (%) |
|---|---|---|---|---|
| Example 1 | 17.3 | 0.86 | 0.75 | 11.2 |
| Example 2 | 17.8 | 0.84 | 0.72 | 10.8 |
| Example 3 | 17.6 | 0.84 | 0.72 | 10.6 |
| Example 4 | 17.7 | 0.85 | 0.72 | 10.8 |
| Example 5 | 17.6 | 0.86 | 0.76 | 11.5 |
| Comparative Example 1 | 16.2 | 0.86 | 0.75 | 10.4 |
| Comparative Example 2 | 11.3 | 0.86 | 0.72 | 7.0 |

EXAMPLE 2

Corresponding to FIGS. 3 and 4, a photoelectric converter in Example 2 was manufactured. In Example 2, polyimide resin insulator layer 11 including a plurality of V shaped grooves, at a pitch of 20 μm, having an opening angle of 60° was formed on stainless foil substrate 1 having a thickness of 50 nm. On insulator layer 11, light diffusion layer 2 was formed in a similar manner to Example 1 except that the spray method was used instead of the roll coater. On light diffusion layer 2, Ag layer 7 having a thickness of 500 nm and ZnO layer 6 having a thickness of 100 nm were successively laminated as a back electrode by the sputtering method.

On ZnO layer 6, a-Si photoelectric conversion layer 5 was deposited under the same condition as Example 1 except that an n sublayer, an i sublayer and a p sublayer were deposited in this order. On a-Si layer 5, ITO transparent electrode layer 3 having a thickness of 60 nm and an Ag comb-shaped current collecting electrode having a thickness of 500 nm were laminated by the sputtering method. The properties of the thus obtained photoelectric converter in Example 2 were measured in a similar manner to Example 1, and the results are also shown in Table 2.

EXAMPLE 3

Corresponding to FIGS. 3 and 4, a photoelectric converter in Example 3 was manufactured. Example 3 is different from Example 2 only in that the material of substrate 1 was changed to aluminum and the material of insulator layer 11 was changed to alumina. The properties of the photoelectric converter in Example 3 were measured in a similar manner to Example 1, and the results are also shown in Table 2.

EXAMPLE 4

Corresponding to FIG. 5, a photoelectric converter in Example 4 was manufactured. In Example 4, a stainless foil having a thickness of 150 μm was used as substrate 1. On substrate 1, light diffusion layer 2 was formed by applying a polyimide resin including silica particles having an average size of 0.3 μm by a roll coater. Thereafter, other layers 6, 5, 3 and 12 were successively formed on light diffusion layer 2 under the same condition as Example 2. The properties of the thus obtained photoelectric converter in Example 4 were measured in a similar manner to Example 1, and the results are also shown in Table 2.

EXAMPLE 5

Corresponding to FIGS. 1 and 2, a photoelectric converter in Example 5 was manufactured. Example 5 is different from Example 1 only in that the material of substrate 1 was changed to a glass plate 7059 manufactured by Corning Inc. The properties of the photoelectric converter in Example 5 were measured in a similar manner to Example 1, and the results are also shown in Table 2.

Comparative Example 1

Similarly to FIG. 1, a photoelectric converter in Comparative Example 1 was manufactured. In Comparative Example 1, an $SnO_2$ layer having a surface texture was formed on a glass substrate, and other layers 3 to 7 were deposited on the $SnO_2$ layer under the same condition as Example 1. The properties of the thus obtained photoelectric converter in Comparative Example 1 were also measured in a similar manner to Example 1, and the results are also shown in Table 2.

Comparative Example 2

Similarly to FIG. 1, a photoelectric converter in Comparative Example 2 was manufactured. In Comparative Example 2, a glass plate 7059 manufactured by Corning Inc. was used as a substrate. Other layers 3 to 7 were directly deposited on the flat top surface of the glass substrate under the same condition as Example 1. The properties of the thus obtained photoelectric converter in Comparative Example 2 were also measured in a similar manner to Example 1, and the results are also shown in Table 2.

It can be seen from Table 2 that the photoelectric converter in Example 5 including light diffusion layer 2 formed on the glass substrate 1, that is, the plate 7059 manufactured by Corning Inc. has the most excellent conversion efficiency. It is also understood that the photoelectric converters in Examples 1 to 4 including light diffusion layer 2 have better conversion efficiency than the photoelectric converter in Comparative Example 1 including the surface texture of $SnO_2$ instead of diffusion layer 2.

As described above, a thin-film photoelectric converter having high conversion efficiency due to a sufficient light confinement effect can be provided easily and inexpensively according to the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photoelectric converter, comprising:
 a first electrode layer, a semiconductor photoelectric conversion layer and a second electrode layer formed in this order on a substrate; and
 a light diffusion layer for causing light diffusion, provided inside the photoelectric converter between said substrate and said first electrode layer;
 said light diffusion layer having a surface texture including fine unevenness suitable for causing said light diffusion and formed by utilizing a resin including particles suitable for causing the surface texture.

2. The photoelectric converter according to claim 1, wherein
 said particles are formed of a selected one of silicon oxide, titanium oxide, aluminum oxide and zirconium oxide and have a size in a range from 0.01 μm to 10 μm.

3. The photoelectric converter according to claim 1, wherein
 the resin included in said light diffusion layer is a selected one of an acrylic resin, a polyimide resin, a polyester resin, a silicone resin and a polyether sulfone resin.

4. The photoelectric converter according to claim 1, wherein
 said substrate is formed of an insulator resin film or glass.

5. The photoelectric converter according to claim 4, wherein
 the resin film of said substrate is formed of a selected one of a polyimide resin, a polyester resin, a polycarbonate resin, a polyether sulfone resin and a fluororesin.

6. The photoelectric converter according to claim 1, wherein
 said substrate is formed of a metal.

7. The photoelectric converter according to claim 6, wherein
 said substrate is formed of a selected one of stainless steel, aluminum, and plated steel.

8. The photoelectric converter according to claim 1, wherein
 an insulator layer is provided on said substrate, said insulator layer has a surface including a plurality of grooves, and said light diffusion layer is formed on the surface including said grooves.

9. The photoelectric converter according to claim 8, wherein
 said insulator layer is formed of a polyimide resin or aluminum oxide.

10. The photoelectric converter according to claim 8, wherein
 said plurality of grooves are arranged at a pitch in a range from 10 μm to 30 μm, and each groove has a V shape in a cross section orthogonal to its longitudinal direction and has a depth in a range from 10 μm to 30 μm and an opening angle in a range from 45° to 120°.

11. The photoelectric converter according to claim 1, wherein
 said substrate is formed of a metallic material selected from a group consisting of stainless steel, aluminum, and plated steel,
 an insulator layer formed of a polyimide resin or aluminum oxide is provided on said substrate, said insulator layer having a surface including a plurality of grooves, and
 said light diffusion layer is formed on the surface including said grooves.

12. The photoelectric converter according to claim 11, wherein
 said plurality of grooves are arranged at a pitch in a range from 10 μm to 30 μm, and each groove has a V shape in a cross section orthogonal to its longitudinal direction and has a depth in a range from 10 μm to 30 μm and an opening angle in a range from 45° to 120°.

* * * * *